US006614682B2

United States Patent
Hirai

(10) Patent No.: US 6,614,682 B2
(45) Date of Patent: Sep. 2, 2003

(54) MAGNETIC MATERIAL MEMORY AND INFORMATION REPRODUCING METHOD OF THE SAME

(75) Inventor: Tadahiko Hirai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/093,522

(22) Filed: Mar. 11, 2002

(65) Prior Publication Data

US 2002/0131296 A1 Sep. 19, 2002

(30) Foreign Application Priority Data

Mar. 13, 2001 (JP) ........................................ 2001-070556

(51) Int. Cl.[7] .............................................. G11C 11/15
(52) U.S. Cl. ........................ 365/173; 365/171; 365/158
(58) Field of Search ................................. 365/173, 171, 365/158

(56) References Cited

U.S. PATENT DOCUMENTS

| | | | |
|---|---|---|---|
| 5,347,485 A | 9/1994 | Taguchi et al. | 365/171 |
| 5,361,226 A | 11/1994 | Taguchi et al. | 365/171 |
| 5,748,519 A | 5/1998 | Tehrani et al. | 365/98 |
| 5,894,447 A | 4/1999 | Takashima | 365/158 |
| 5,936,882 A | 8/1999 | Dunn | 365/158 |
| 5,986,925 A | 11/1999 | Naji et al. | 365/158 |
| 6,055,178 A | 4/2000 | Naji | 365/158 |
| 6,191,972 B1 | 2/2001 | Miura et al. | 365/171 |
| 6,351,408 B1 * | 2/2002 | Schwarzl et al. | 365/173 |
| 6,359,829 B1 | 3/2002 | Van Den Berg | 365/232 |

* cited by examiner

Primary Examiner—Huan Hoang
(74) Attorney, Agent, or Firm—Fitzpatrick, Cella, Harper & Scinto

(57) ABSTRACT

To provide an MRAM, in which the information readout speed of the MRAM is increased up to a speed comparable to a synchronous DRAM, the MRAM includes a plurality of units each including a plurality of memory elements arranged in a matrix form, each of which includes a non-magnetic layer sandwiched between a hard layer made of a magnetic material and a soft layer made of a magnetic substance having coercive force lower than the hard layer; a plurality of bit lines arranged in parallel with each other; and a plurality of sense amplifiers connected to the respective bit lines, wherein the plurality of sense amplifiers in the same unit are activated at the same time to read out information in the unit, the units are successively changed over in synchronization with a clock pulse, and the sense amplifiers in the different units are successively activated.

11 Claims, 12 Drawing Sheets

MAGNETIC MATERIAL MEMORY AND INFORMATION REPRODUCING METHOD OF THE SAME

BACKGROUND OF THE INVENTION

1. Field of the Invention

The present invention relates to a nonvolatile solid memory for storing information, and more particularly to an MRAM using a magnetic material.

2. Related Background Art

In general, a magnetic material such as a ferromagnetic material or a ferrimagnetic material has such a property that magnetization generated in the magnetic material by a magnetic field applied from the outside remains even after the external magnetic field is removed (this is called residual magnetization). Besides, the electric resistance of the magnetic material is changed according to the direction of the magnetization or the existence of the magnetization. This is called a magneto-resistance effect, and the rate of change in the electric resistance value at that time is called an MR ratio (Magneto-Resistance Ratio). As a material having a large MR ratio, there is a GMR (Giant Magneto-Resistance) element or a CMR (Colossal Magneto-Resistance) element, and these are made of metal, alloy, compound oxide, or the like. For example, the material includes Fe, Ni, Co, Gd, Tb, alloys of these, and compound oxide such as $La_xSr_{1-x}MnO_9$ or $La_xCa_{1-x}MnO_9$. If the residual magnetization of the magneto-resistance material is used, a nonvolatile memory can be formed which stores information by selecting an electric resistance value according to the direction of the magnetization or the existence of the magnetization. Such a nonvolatile memory is called an MRAM (Magnetic Random Access Memory).

Most MRAMs under development in recent years use, as a memory element, a magneto-resistance effect element having such a structure that a non-magnetic layer is sandwiched between magnetic layers, and adopt a system in which stored information is read out by converting a change of an electric resistance value, which is caused by a difference in the magnetization direction, into a voltage. Besides, information can be written and can be rewritten by causing a current to flow to a writing wiring and changing the magnetization direction of a memory cell by an induced magnetic field.

The readout of information of the conventional MRAM is such that a current is caused to flow to the memory element storing the information with the residual magnetization of the magnetic material and the resistance value is converted into a voltage so that the information is read out. In this information readout method, a delay occurs by the magneto-resistance element functioning as a resistance. This delay is a main cause of lowering the readout speed of the MRAM. Thus, a large scale MRAM chip has a tendency that the readout speed is low as compared with a synchronous DRAM or SRAM.

Besides, as another information readout method of the conventional MRAM, there is a differential detection method in which in order to read out information stored in one memory cell, a resistance state of a memory cell is changed, and a readout operation is carried out for the same memory cell twice before and after that. In this case, the influence by the delay of the memory element becomes more remarkable. In the present circumstances, a method of carrying out the readout at high speed in such an MRAM has not been achieved.

SUMMARY OF THE INVENTION

The present invention has been made in view of the unsolved problems of the related art as stated above, and has an object to provide an MRAM in which the information readout speed of the MRAM is increased up to a speed comparable to a synchronous DRAM, and an information reproducing method of the same.

In order to achieve the above-mentioned object, according to the present invention, there is provided an MRAM comprising a plurality of units each including: plurality of memory elements arranged in a matrix form, each of which includes a non-magnetic layer sandwiched between a hard layer made of a magnetic material and a soft layer made of a magnetic material having coercive force lower than the hard layer; plurality of bit lines arranged in parallel with each other; and plurality of sense amplifiers connected to the respective bit lines, in which the plurality of sense amplifiers in the same unit are activated at the same time to read out information in the unit, the units are successively changed over in synchronization with a clock pulse, and the sense amplifiers in the different units are successively activated, so that information in the plurality of units is parallel outputted in synchronization with the clock pulse, and information of each of the units is continuously reproduced.

DESCRIPTION OF THE PREFERRED EMBODIMENTS

Embodiments of the present invention will be described in detail with reference to the drawings.

Figure 1:
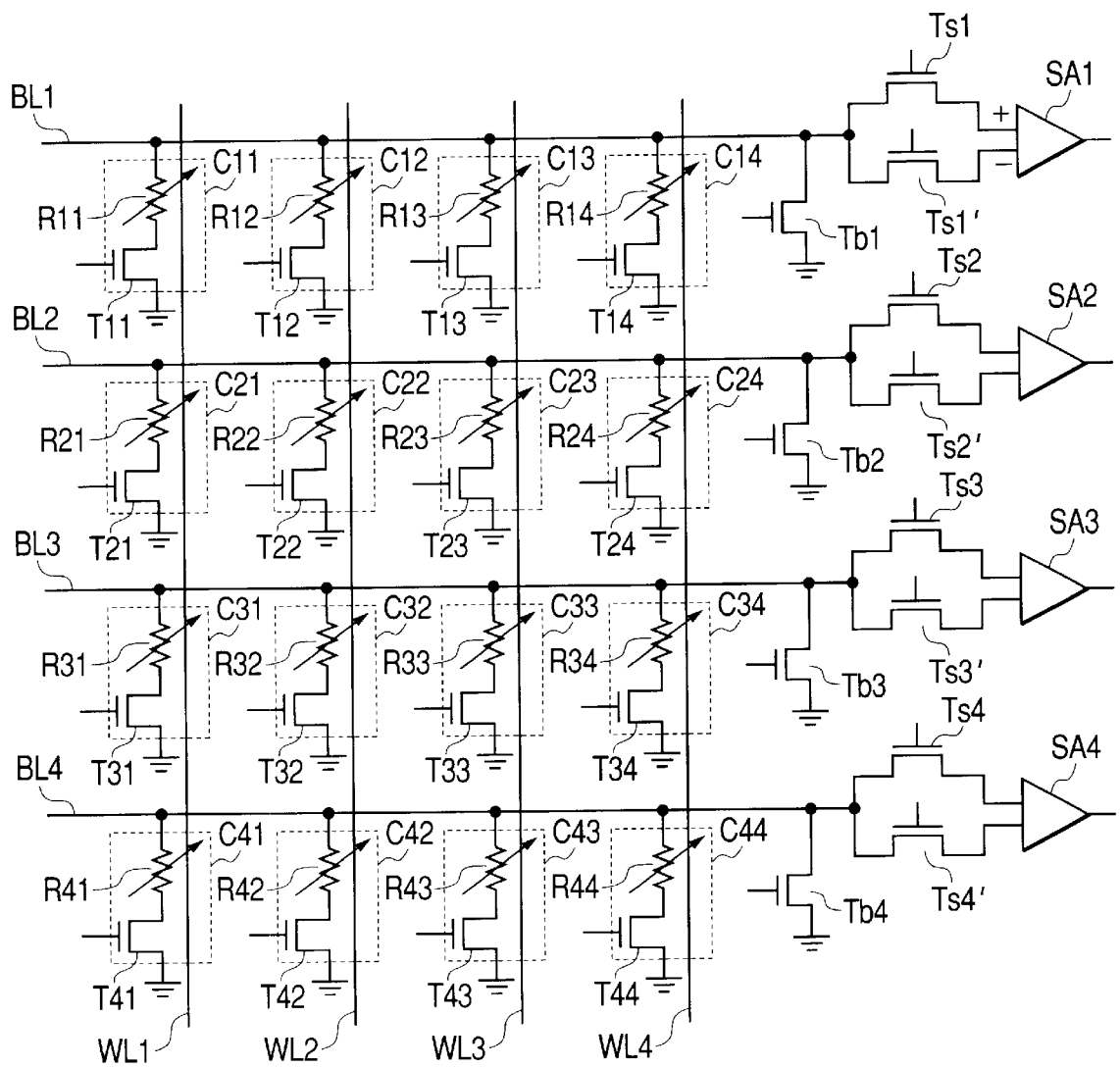
FIG. 1 is a circuit structural view showing a structure of a ferromagnetic substance memory of an embodiment of the present invention.

FIG. 1 is a circuit structural view showing an MRAM of an embodiment of the present invention.

The MRAM of this embodiment includes memory cells C11, C12, C13, C14, C21, C22, C23, C24, C31, C32, C33, C34, C41, C42, C43, C44, arranged in a 4×4 matrix state writing lines WL1, WL2, WL3, WL4, bit lines BL1, BL2, BL3, BL4, field effect transistors Ts1, Ts2, Ts3, Ts4, field effect transistors Ts1', Ts2', Ts3', Ts4', field effect transistors Tb1, Tb2, Tb3, Tb4, sense amplifiers SA1, SA2, SA3, SA4, and word lines WDL1 to WDL4.

The bit lines BL1, BL2, BL3, BL4 are arranged in parallel with each other, and the writing lines WL1, WL2, WL3, WL4 are parallel with each other and are arranged to intersect with the bit lines BL1, BL2, BL3, BL4.

The memory cell C11 includes a memory element selecting field effect transistor T11 and a memory element R11 functioning as a variable resistor in which an electric resistance value can be changed by selecting a magnetization direction of a magnetic substance. As the memory element, although any element may be used as long as a magneto-resistance effect can be obtained, a TMR (Tunnel Magneto-Resistance) element having such a structure that an insulating layer is sandwiched between magnetic layers, is particularly preferable since an MR ratio is large. Besides, a drain of the field effect transistor T11 is connected with one terminal of the TMR element R11, and a source of the field effect transistor T11 is grounded.

The other memory cells have the same structure.

The gates of the field effect transistors T11, T21, T31, T41; T12, T22, T32, T42; T13, T23, T33, T43; T14, T24, T34, T44 are connected to the common word lines. These are provided particularly to select a specified memory element to carry out reproducing at the time of information regeneration. The word line is a wiring for turning on and off the field effect transistor by applying a predetermined voltage to the gate.

Besides, the other terminal of the TMR element is connected to the bit line BL1. The field effect transistors Ts1, Ts2, Ts3, Ts4, Ts1', Ts2', Ts3', Ts4' are such switching elements that when they are turned on, the voltage levels of the bit lines BL1, BL2, BL3, BL4 are inputted to input terminal of the corresponding sense amplifiers SA1, SA2, SA3, SA4.

The sense amplifiers SA1, SA2, SA3, SA4 are signal detection circuits which output "1" or "0" according to the result of a comparison between the levels of two input voltages.

The field effect transistors Tb1, Tb2, Tb3, Tb4 are such switching elements that they are turned on when writing currents are made to flow to the corresponding bit lines, and ground the respective bit lines to cause the writing currents to flow.

The writing of information in the MRAM shown in FIG. 1 is carried out by causing currents to flow to both a desired bit line and writing line. Besides, the readout of information is carried out in such a manner that two field effect transistors (for example, Ts1 and Ts1') connected to one sense amplifier (for example, SA1) are successively turned on, and a voltage variation at that time is detected by the sense amplifier.

These circuits are formed on a semiconductor substrate.

Figure 2A:
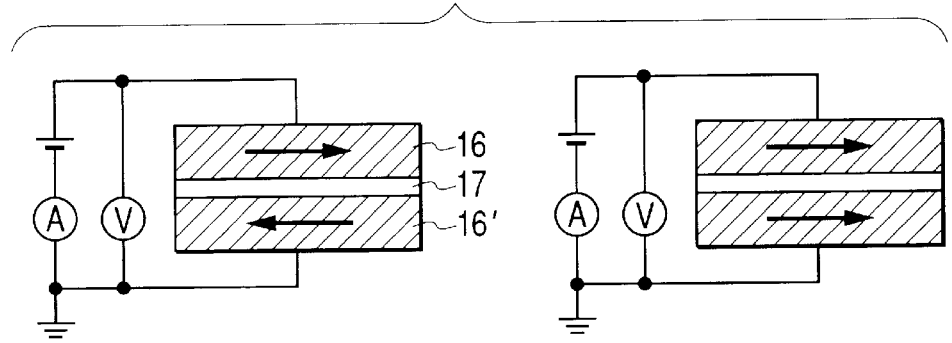
FIGS. 2A and 2B are explanatory views for explaining examples of magnetization of a TMR element in a case of horizontal magnetization (FIG. 2A) and vertical magnetization (FIG. 2B)
Figure 2B:
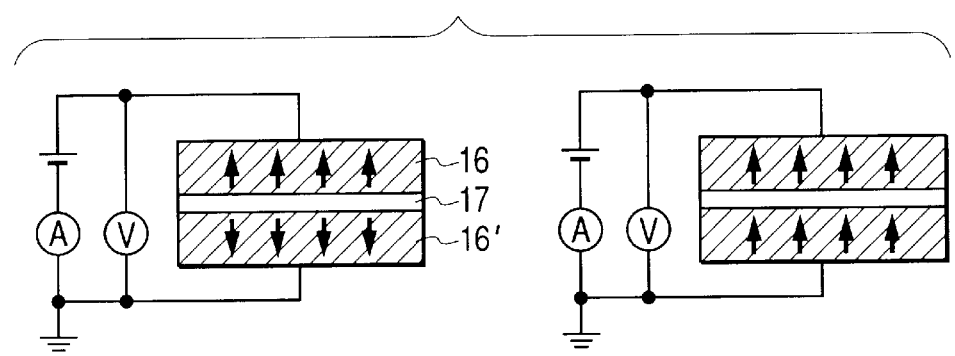

FIGS. 2A and 2B are views schematically showing magnetization states of magneto-resistance effect elements used as memory elements. FIG. 2A shows a horizontal magnetization film, and FIG. 2B shows a vertical magnetization film. The horizontal magnetization means that magnetization occurs in a film plane, and the vertical magnetization means that magnetization occurs perpendicularly to the film plane. In either case, the magnetization of a magnetic film is inverted by a magnetic field induced by a current flowing to a wiring. In this embodiment, although either of the horizontal magnetization and the vertical magnetization may be used, for the purpose of achieving high memory density, it is especially preferable to use the vertical magnetization film since the memory element can be easily made small.

In either case of the horizontal magnetization (FIG. 2A) and the vertical magnetization (FIG. 2B), the memory element has such a structure that a nonmagnetic film 17 such as a tunnel insulating film is sandwiched between a magnetic material film (hard layer) 16 having high coercive force and a magnetic material film (soft layer) 16' having coercive force lower than the former. A flowing tunnel current is different between a case where the magnetization directions of the two magnetic films 16, 16' are in parallel with each other and in the same direction (hereinafter referred to as parallel) and a case where they are in parallel with each other and in the opposite direction (hereinafter referred to as anti-parallel), and the resistance value of the memory element is different. Note that, instead of the tunnel insulating film 17, a conductive layer may be naturally used to form a GMR element.

Figure 3:
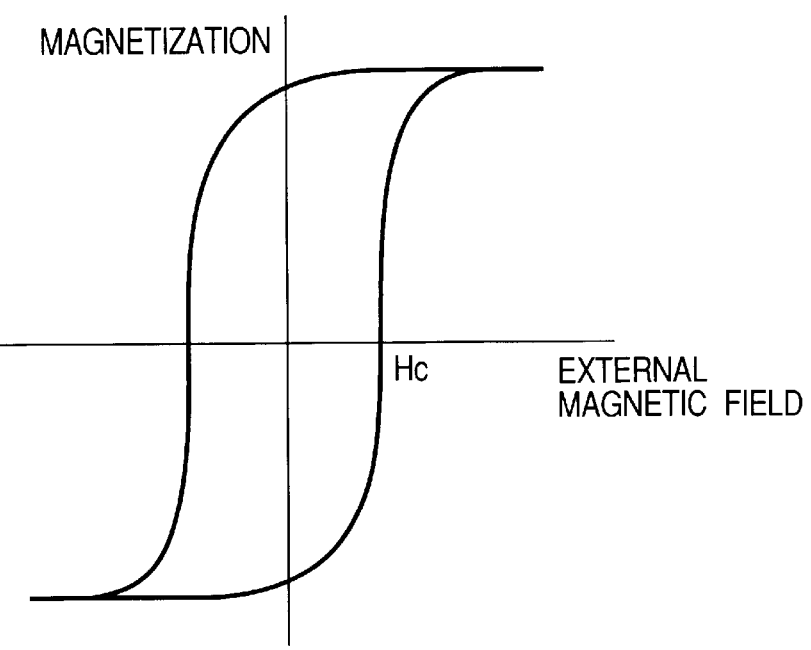
FIG. 3 is a graph showing a relation between the external magnetic field of a magnetic material and the magnetization.

The change of the magnetization at the time when an external magnetic field is applied to the hard layer 16 and the soft layer 16' draws a hysteresis curve as shown in FIG. 3. For example, in the case where magnetization given from the outside to the magnetic film magnetized in a negative direction (lower part in FIG. 3) is gradually increased, when it exceeds a predetermined magnetic field intensity Hc, magnetization in a positive direction starts, and when it reaches a predetermined magnitude, the magnetization is saturated. Since the magnetic films 16 and 16' are different in coercive force, they are different from each other in magnetic field intensity at which the magnetization starts and in magnetic field intensity at which the magnetization is saturated. The magnetic field intensity at which the magnetization of the magnetic film 16 having high coercive force starts is higher than the magnetic field intensity at which the magnetization of the magnetic film 16' having low coercive force is saturated.

For example, as a layer for holding information, the hard layer 16 having high coercive force is used. When stored information is rewritten, the magnetization direction of the hard layer 16 is changed. Thus, a relatively large external magnetic field is required to rewrite the information. In this embodiment, writing currents are made to flow to both the writing line (WL) and the bit line (BL) to select a specified memory element by a resultant magnetic field at the intersection, and the magnetization direction of the hard layer 16 is determined. According to the structure of the embodiment, the soft layer 16' may be such that its coercive force is low and information can not be ensured for a long time, and the magnetization can be inverted by applying a relatively low external magnetic field at a readout operation. The magnetic layers are adjusted so that even if the magnetization of the soft layer 16' is inverted at the time of readout, the magnetization of the hard layer 16 is not inverted. Besides, information may be naturally recorded by the magnetization direction of the soft layer while the magnetization of the hard layer is fixed.

As a material of the memory element, a metal material, an alloy, or the like is used for the magnetic film of the hard layer 16 and the soft layer 16', and an oxide insulating material such as Al2O3 is often used for the tunnel insulating film 17.

A memory chip in this embodiment is constructed using the foregoing memory cell.

Figure 4:
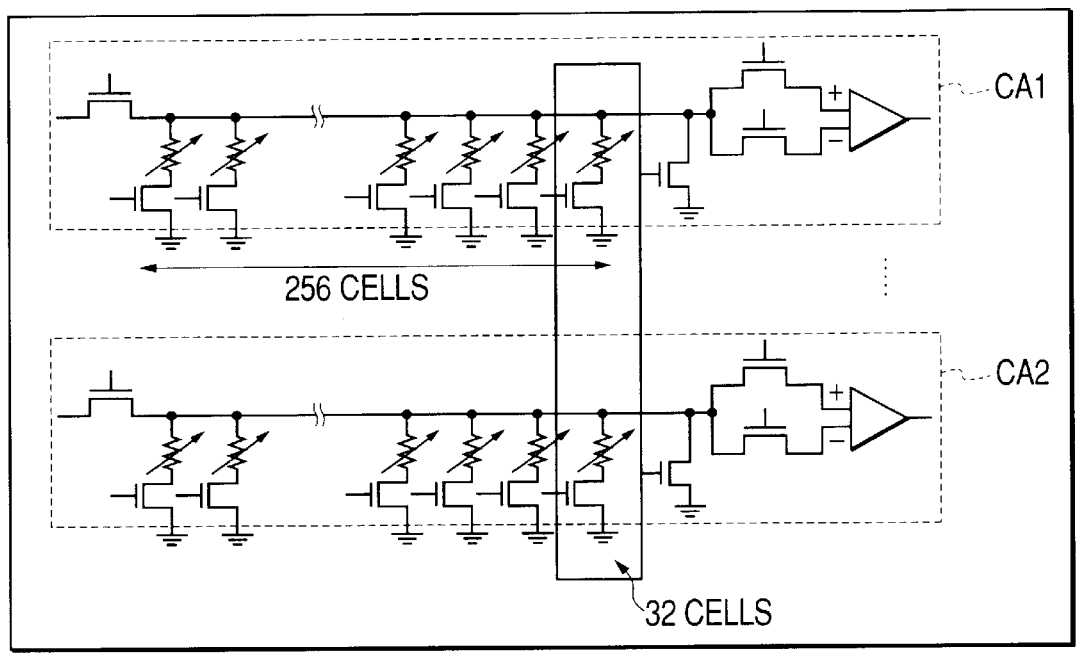
FIG. 4 is a first explanatory view for explaining a cell structure in the embodiment.
Figure 5:
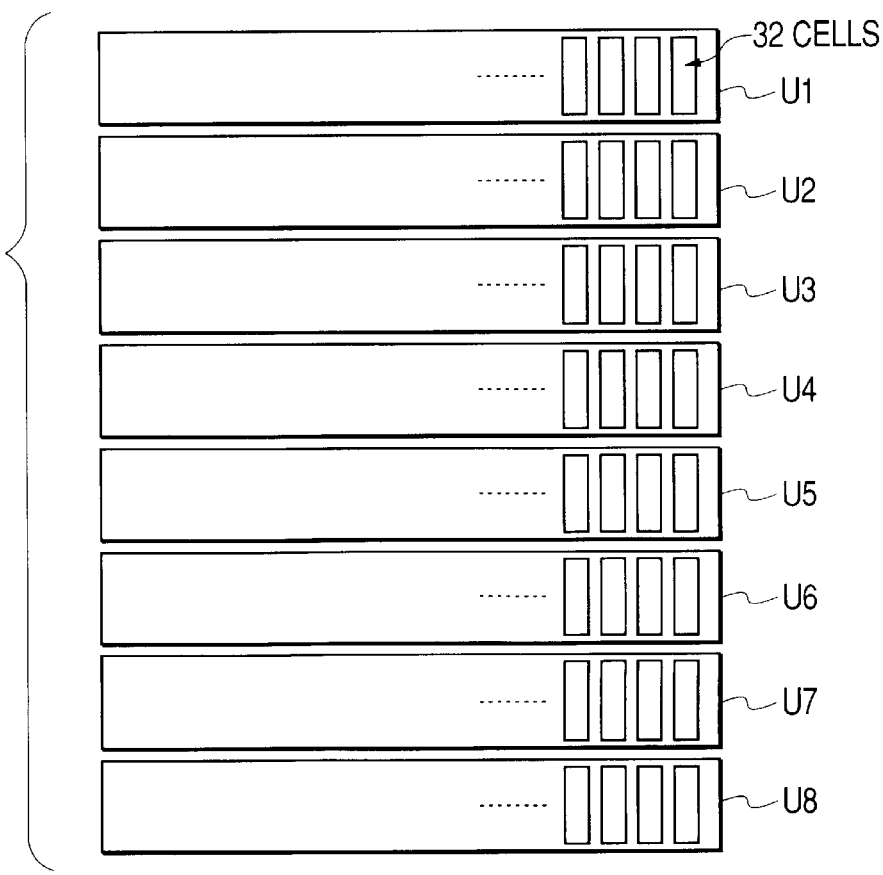
FIG. 5 is a second explanatory view for explaining the cell structure in the embodiment.

FIG. 4 shows a memory cell array in a memory chip including the foregoing memory cell. Each of memory cell arrays CA1 to CA2 includes 256 memory cells connected to one bit line. Each of units is constituted by the 32 memory cell arrays CA1 to CA2. Accordingly, one unit includes the memory cells of about 8 kilobits, and a current pulse is simultaneously applied to a group of 32 sense amplifiers to start them at once, so that information of 32 bits can be parallel read out by one operation. Further, as shown in FIG. 5, by the use of the unit having the recording capacity of 8 kilobits, a memory chip of about 64 kilobits is constituted by eight units U1 to U8. When the division of memory cells is changed in FIGS. 4 and 5, each of the units U1 to U8 may be regarded as including 256 memory cell groups each composed of 32 memory cells.

Next, a process of reading out information from such an MRAM will be described. Here, as an example, a memory cell array including four sense amplifiers is used, and a case where parallel readout is carried out from a plurality of memory cell arrays in a unit will be described with reference to FIGS. 6 to 9. Although FIGS. 6 to 9 exemplify a horizontal magnetization matrix cell of 4×4 bits, also in the foregoing unit including the matrix cell of 256×32 bits, parallel readout can be carried out by the same method.

Here, a case where information stored in memory elements R13, R23, R33, R43 are parallel read out will be described as an example.

Figure 6:
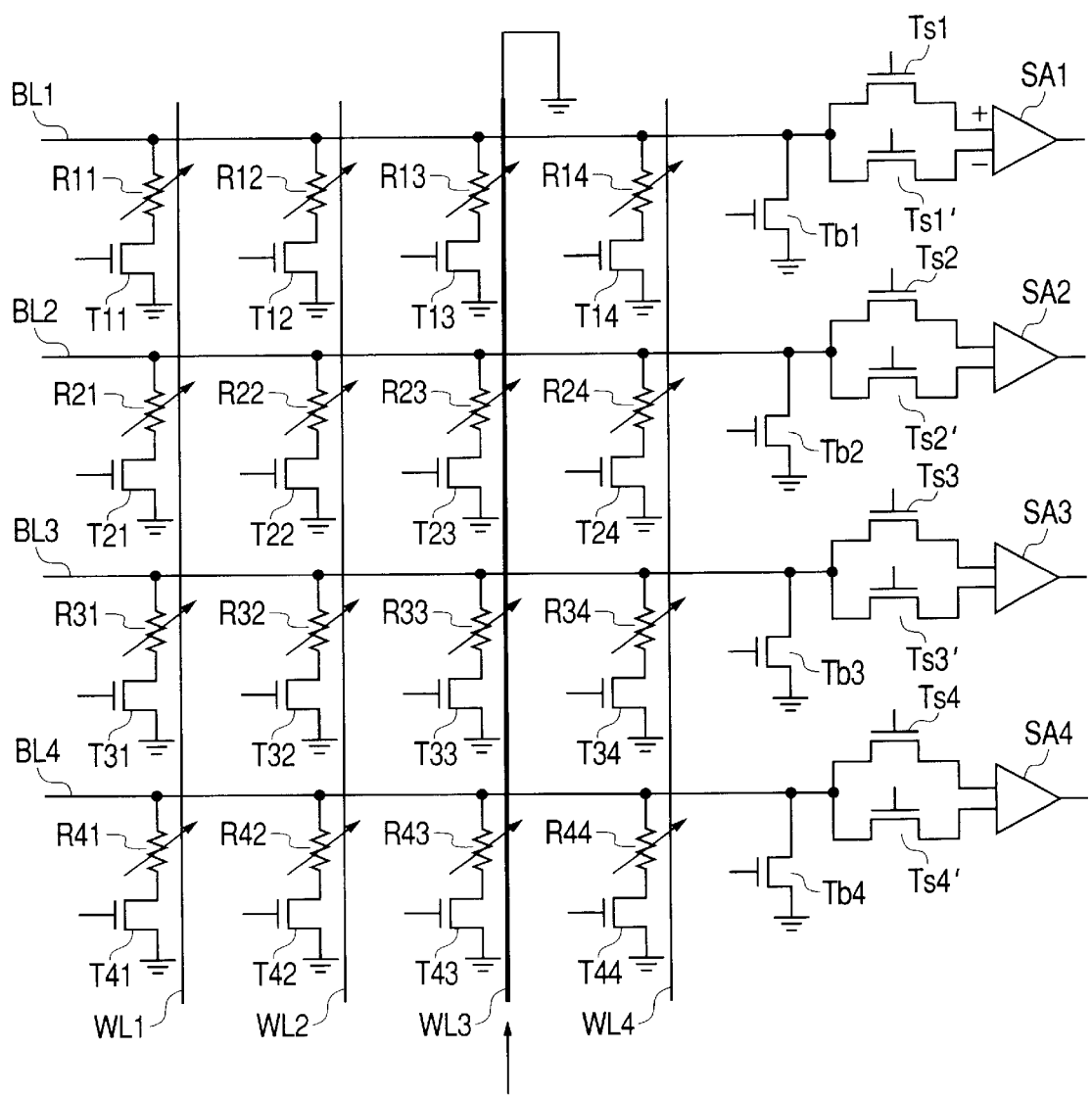
FIG. 6 is an explanatory view for explaining an operation for magnetizing a soft layer in a predetermined direction by causing a current to flow to a writing line.

First, as shown in FIG. 6, a pulse current in an arrow direction is made to flow to only a writing line WL3 to generate magnetization facing the right in FIG. 6 in soft layers of the TMR elements R13, R23, R33, R43. By this, in a cell in which the magnetization of the hard layer faces the right, the magnetization of the hard layer and that of the soft layer become parallel to each other, and a low resistance state occurs. Besides, in a cell in which the magnetization of the hard layer faces the left, the magnetization of the hard layer and that of the soft layer become anti-parallel to each other, and a high resistance state occurs.

Figure 7:
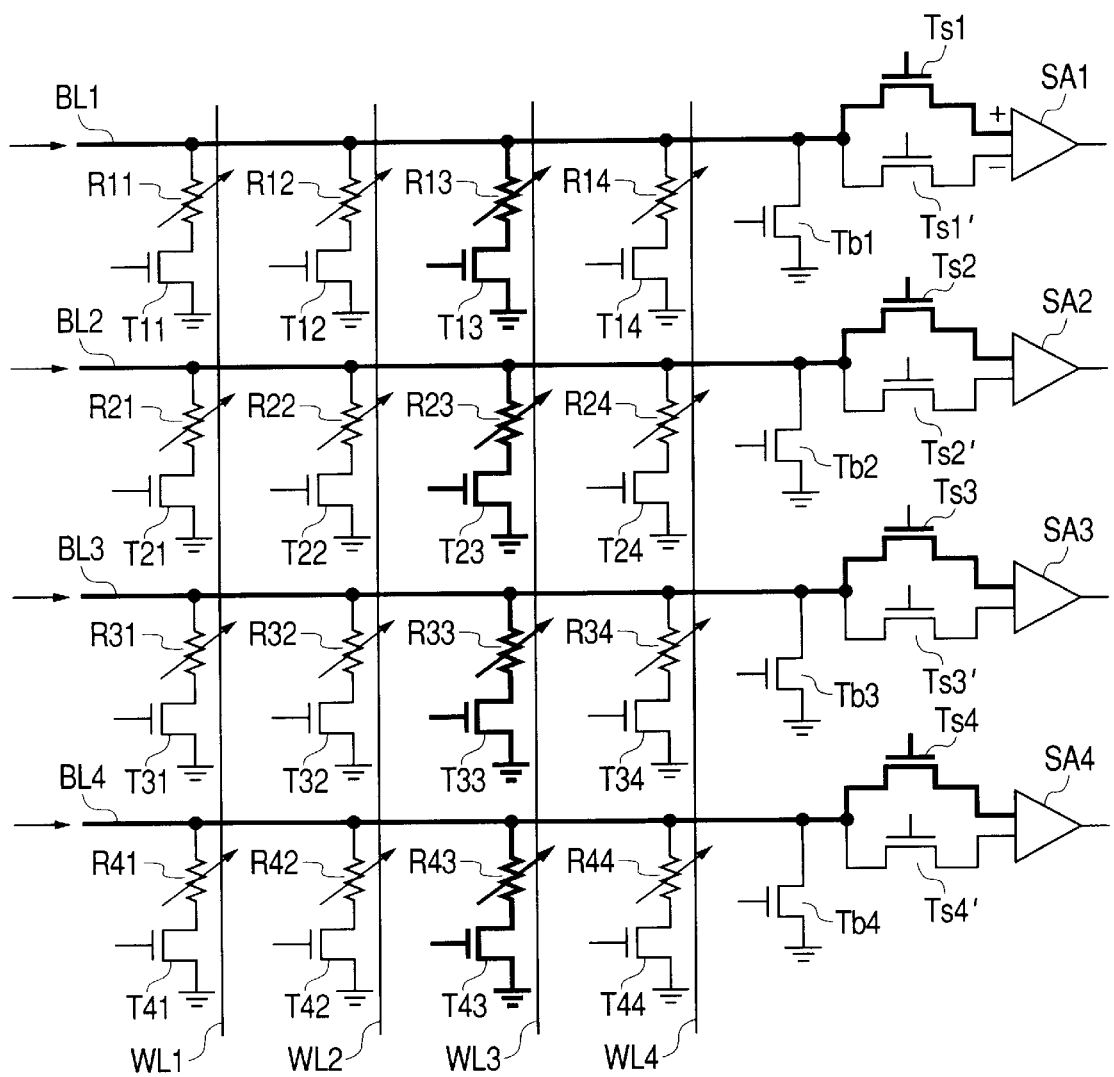
FIG. 7 is an explanatory view for explaining an operation when a current is made to flow to a TMR element.

Next, as shown in FIG. 7, in a state where the field effect transistors T13, T23, T33, T43 are turned on by applying a predetermined voltage to a word line, constant currents are made to flow to bit lines BL1, BL2, BL3, BL4, and further, field effect transistors Ts1, Ts2, Ts3, Ts4 are turned on, so that the respective potentials of the bit lines BL1, BL2, BL3, BL4 are inputted to the plus side terminals of sense amplifiers SA1, SA2, SA3, SA4.

Figure 8:
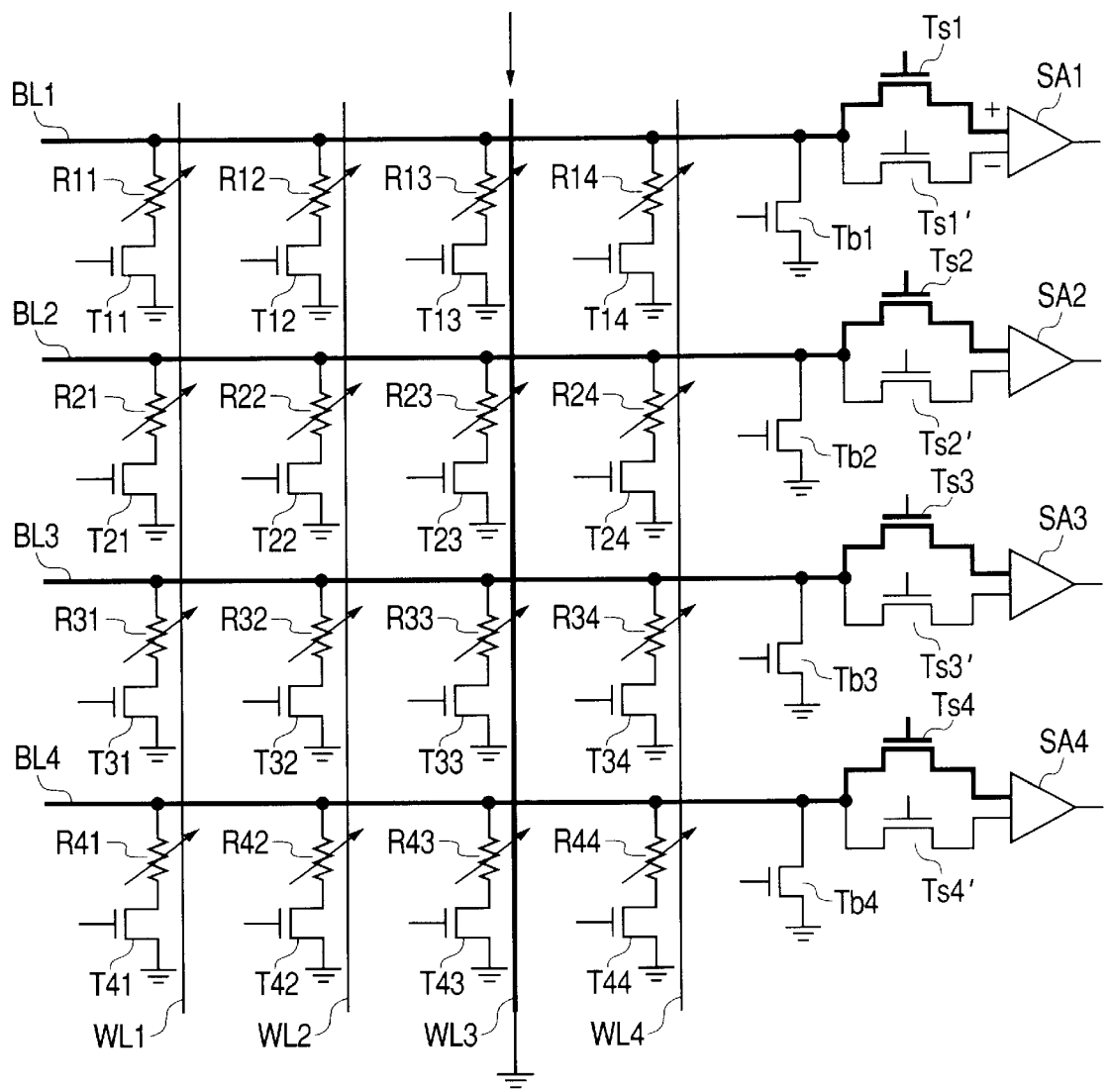
FIG. 8 is an explanatory view for explaining an operation of inverting a magnetization direction of a soft layer.

Next, as shown in FIG. 8, a pulse current in an arrow direction is made to flow to only the writing line WL3, and magnetization opposite to that of FIG. 6 is generated in the soft layer of the TMR elements R13, R23, R33, R43. By this, in the cell in which the magnetization of the hard layer faces the right, the magnetization of the hard layer and that of the soft layer become anti-parallel to each other, and the high resistance state occurs. Besides, in the cell in which the magnetization of the hard layer faces the left, the magnetization of the hard layer and that of the soft layer become parallel to each other, and the low resistance state occurs.

Figure 9:
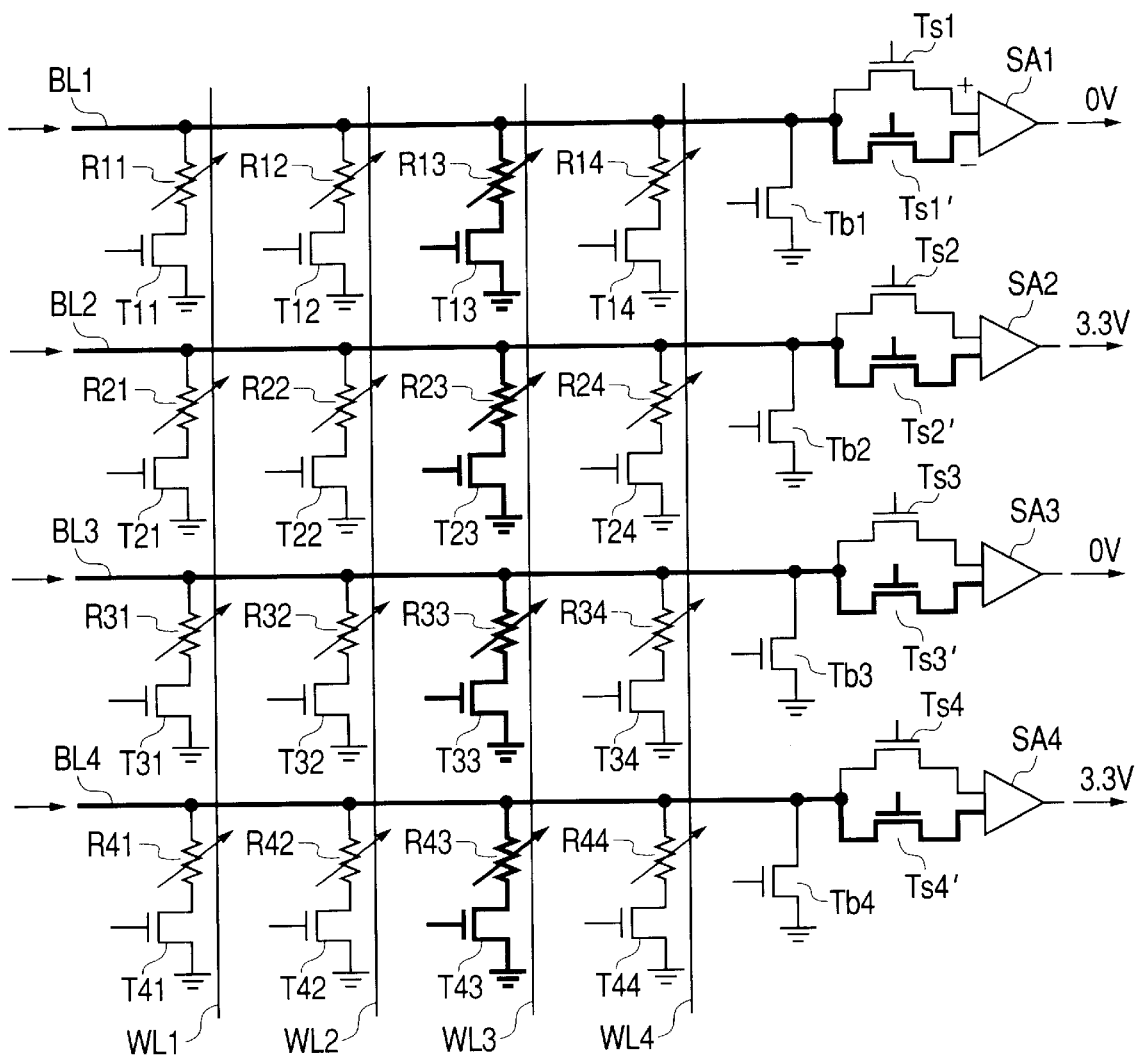
FIG. 9 is an explanatory view for explaining an operation when a current is made to flow to the TMR element again.

Next, as shown in FIG. 9, constant currents are made to flow to the bit lines BL1, BL2, BL3, BL4 in a state where the TMR elements T13, T23, T33, T43 are turned on, and further, the field effect transistors Ts1', Ts2', Ts3', Ts4' are turned on, so that the respective potentials of the bit lines BL1, BL2, BL3, BL4 are inputted to the minus side terminals of the sense amplifiers SA1, SA2, SA3, SA4.

As a result, among the respective bit lines BL1, BL2, BL3, BL4, the sense amplifier arranged at one connected with the hard layer having the magnetization facing the left outputs a "High" level signal. Besides, the sense amplifier arranged at one connected with the hard layer having the magnetization facing the right outputs a "Low" level signal. For example, when it is assumed that the magnetization direction of the hard layer faces the right in the TMR elements R13 and R33, and the magnetization direction of the hard layer faces the left in the TMR elements R23 and R43, the sense amplifiers SA1 and SA3 output the "High" level signal, and the sense amplifiers SA2 and SA4 output the "Low" level signal.

Figure 10:
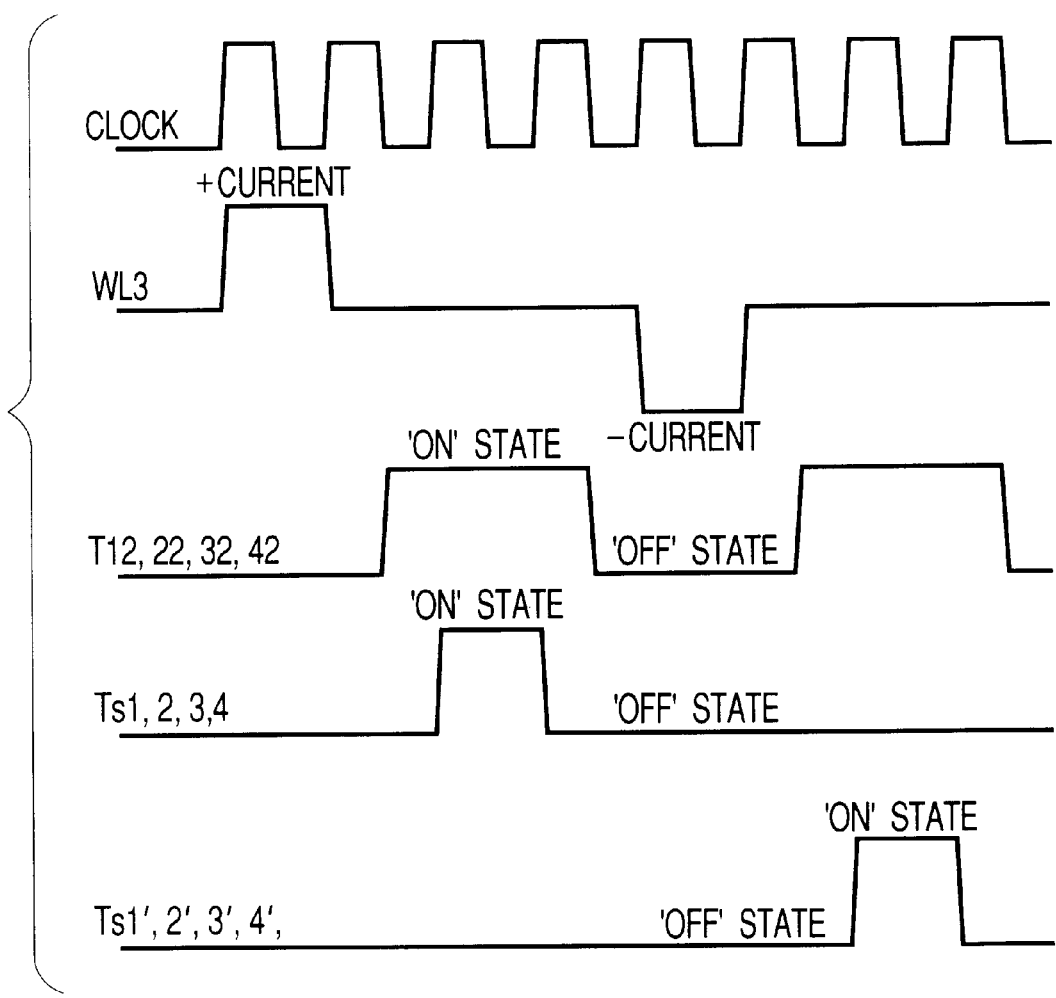
FIG. 10 is a timing chart showing a readout operation of the ferromagnetic material memory of the embodiment.

FIG. 10 is a timing chart showing the operation states of the respective wirings and FETs in the readout method of FIGS. 6 to 9. According to FIG. 10, it is understood that information of four bits is parallel outputted in a time of eight clock pulses.

Figure 11:
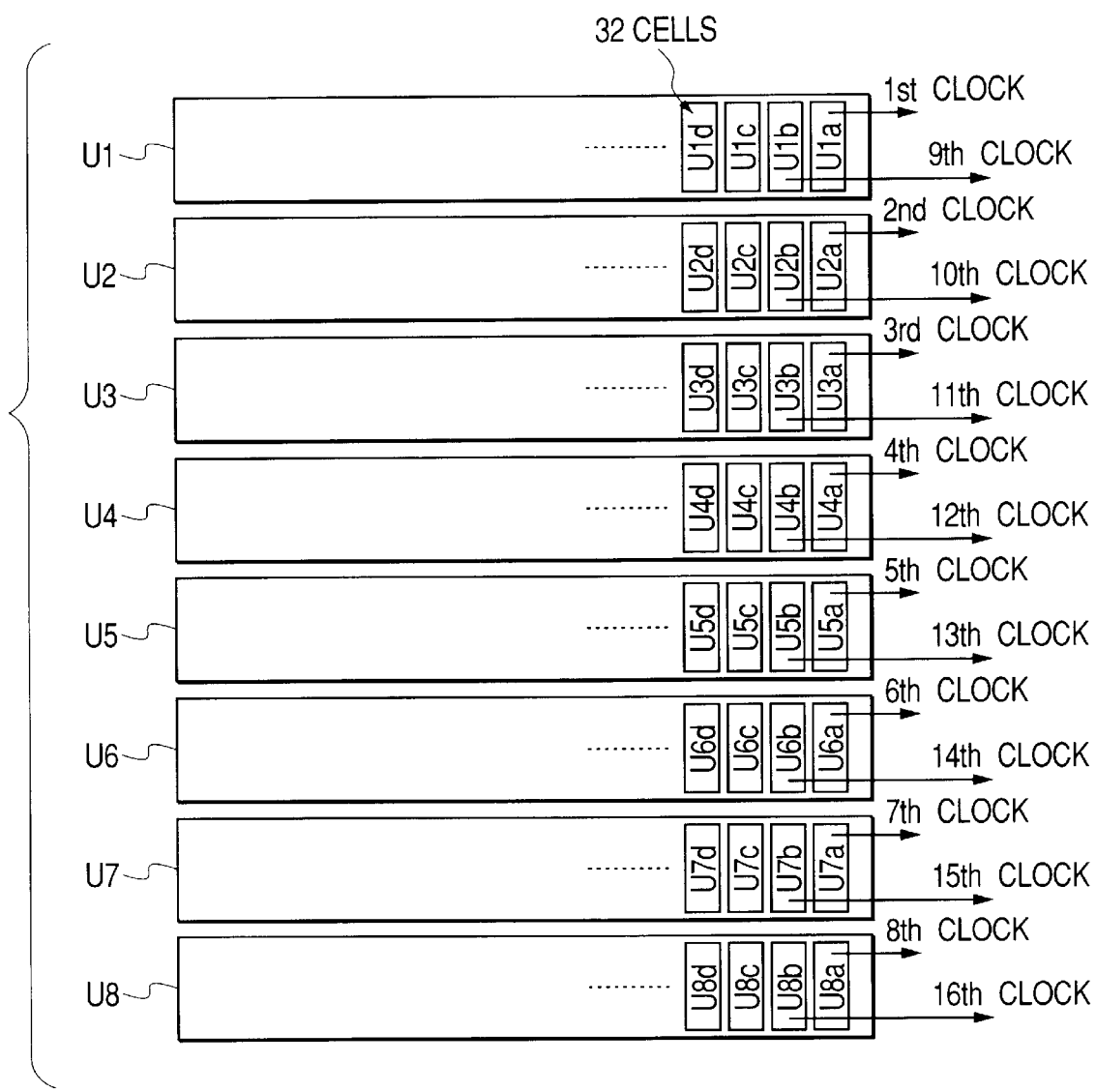
FIG. 11 is a schematic view showing the readout operation of the ferromagnetic material memory of the embodiment.

FIG. 11 is an explanatory view for explaining a readout method of information stored in a memory chip in which eight units each having 256×32 memory cells are disposed.

In each of the units U1, U2, U3, U4, U5, U6, U7, U8, a desired memory cell group is selected by a similar method to that shown in FIGS. 6 to 9, and when 32 sense amplifiers are activated at the same time, data of 32 bits are outputted in parallel.

Each of the units U1, U2, U3, U4, U5, U6, U7, U8 includes 256 memory cell groups. Here, attention is given to four memory cell groups of each unit, which are shown in FIG. 11.

First, access to 32 memory cells of a memory cell group U1a is started by a clock of a first pulse. The access to the memory cell group 1a is carried out similarly to that shown in FIG. 10, and information is outputted by a clock of an eighth pulse.

Next, access to 32 memory cells of a memory cell group U2a is started by a clock of a second pulse. The access to the memory cell group U2a is also carried out similarly to that shown in FIG. 10, and information is outputted by a clock of a ninth pulse.

Hereinafter, in the same manner, access to a memory cell group U3a is started by a clock of a third pulse, and an access to a memory cell group U4a is started by a clock of a fourth pulse. Besides, when access is started up to a memory cell group U8a, next, access to a memory cell group U1b is started.

Accordingly, information of 32 bits is outputted every clock subsequent to an eighth pulse. For example, if the readout of the MRAM is carried out by the readout method of this embodiment at a clock frequency of 66 MHz, first 32-bit data is outputted after 120 nsec from the start of the first access, and then, 32-bit data is outputted every 15 nsec.

A memory array set including the matrix type memory cells, the sense amplifiers, and the like is called a unit, and a memory chip is constituted by a plurality of units (for example, eight units).

Besides, in general, a clock pulse of a predetermined frequency is used to drive a memory element, and the timing of voltage application, the start of the sense amplifier, and the like are synchronized. As an example, in this embodiment, the description has been made under a clock frequency of 66 MHz (that is, frequency of 15 ns.).

As described above, in the present invention, the sense amplifiers of the units are successively activated (for example, up to eight units) in such a manner that a plurality of sense amplifiers (for example, 32 sense amplifiers) in a certain unit are activated in synchronization with a clock pulse so that information in the unit is read out at the same time, a plurality of sense amplifiers in another unit are activated in synchronization with a next clock pulse so that information in the unit is read out at the same time, and subsequently, a plurality of sense amplifiers in still another unit are activated in synchronization with a further next clock pulse.

The sense amplifiers of the first unit completes the output of the information until the eighth pulse of the clock, and can start the next readout operation from the ninth clock pulse of the clock. By this operation, the information (32 bits) of the 32 sense amplifiers can be outputted per clock pulse, and further, information is successively outputted every clock pulse.

If the readout method of this embodiment is applied to a driving method in which the magnetization direction of the soft layer 16' is inverted to change the electric resistance value of the variable resistor, and information is read out from a difference between potentials before and after the inversion, the information of the MRAM can be read out at an information readout speed comparable to a synchronous DRAM. This is one of great features of the present invention.

Further, a capacitor charged by a potential of a bit line at a readout operation may be provided between the input terminal of the sense amplifier and the ground potential. In the sense amplifier, since the potential of one input terminal is held as a reference value by the capacitor, after the magnetization direction of the soft layer 16' is inverted, the potential given to the other input terminal is compared with the reference value.

Figure 12:
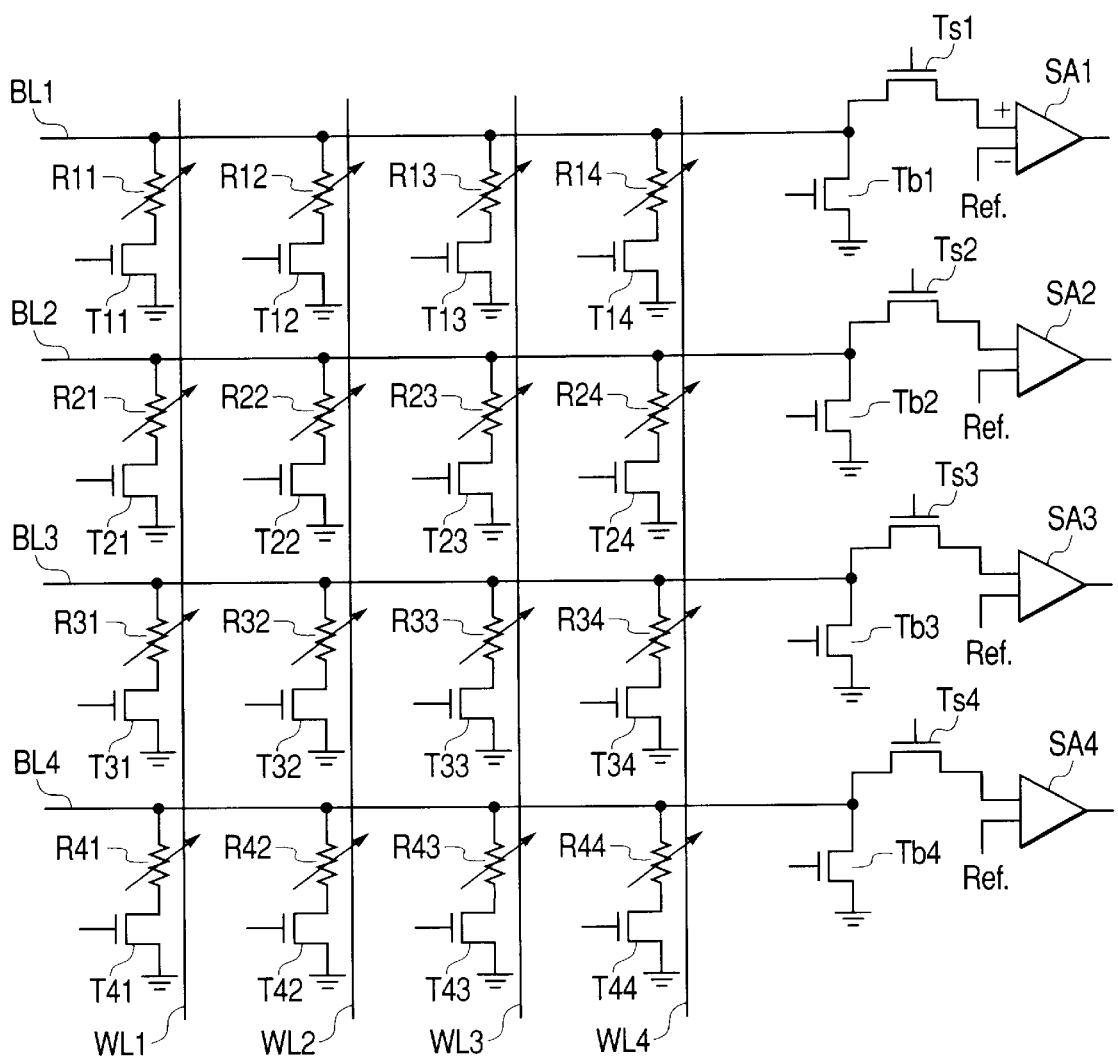
FIG. 12 is an equivalent circuit view for explaining a structure in which absolute detection is carried out for readout.

Note that, a circuit for generating a predetermined reference value as a voltage signal is provided, and the voltage signal of the reference value generated by the circuit may be inputted to the other input terminal of the sense amplifier. This case is shown in FIG. 12. In this case, the sense amplifier compares the voltage level of the one input terminal, that is, the voltage level of the bit line with the voltage level of the other input terminal, that is, the reference value. Note that, in this case, as the circuit for generating the predetermined reference value, a reference cell having the same structure as the memory cell may be used, or a circuit in which memory elements of a high resistance state and a low resistance state are parallel connected may be used. Of course, a power supply circuit for generating a voltage may be separately provided.

Next, specific examples of the MRAM of this embodiment will be described.

(First Specific Example)

In a first specific example, a description will be given of a case where a TMR element having such a structure that a tunnel insulating film is sandwiched between two magnetic thin films is used as a memory element.

Here, the memory element has the structure in which the tunnel insulating film is sandwiched between the hard layer having high coercive force and the soft layer having coercive force lower than the former, and as shown in FIG. 2A, the horizontal magnetization is caused. Since the magnetization direction is held as long as a magnetic field is not applied from the outside, a nonvolatile memory can be realized.

First, an experimental manufacturing process of the memory of the first specific example will be described.

Figure 13:
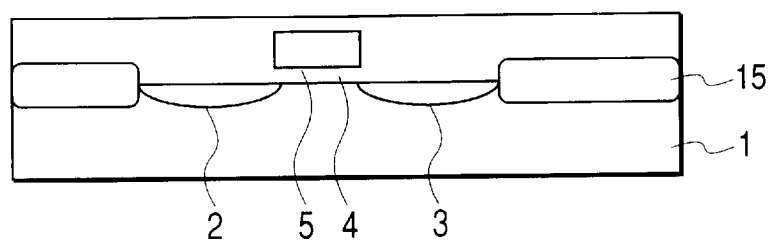
FIG. 13 is a first sectional view showing an experimental manufacturing process of a first specific example.

As shown in FIG. 13, an embedded element separation region 15 made of $SiO_2$, an n-type diffusion region 3 and an n-type diffusion region 2 forming a drain and a source of a field effect transistor functioning as a switching element, an SiO2 gate insulating film 4, and a polysilicon gate electrode 5 are formed on a p-type silicon substrate 1.

Figure 14:
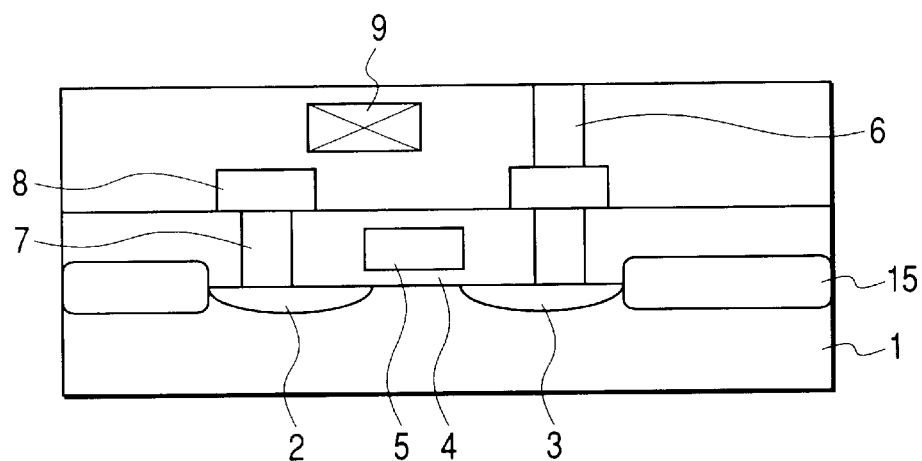
FIG. 14 is a second sectional view showing the experimental manufacturing process of the first specific example.

Further, as shown in FIG. 14, an AlSiCu earth line 8 connected to the source of the field effect transistor through a tungsten plug 7 and a writing wiring 9 are provided.

Figure 15:
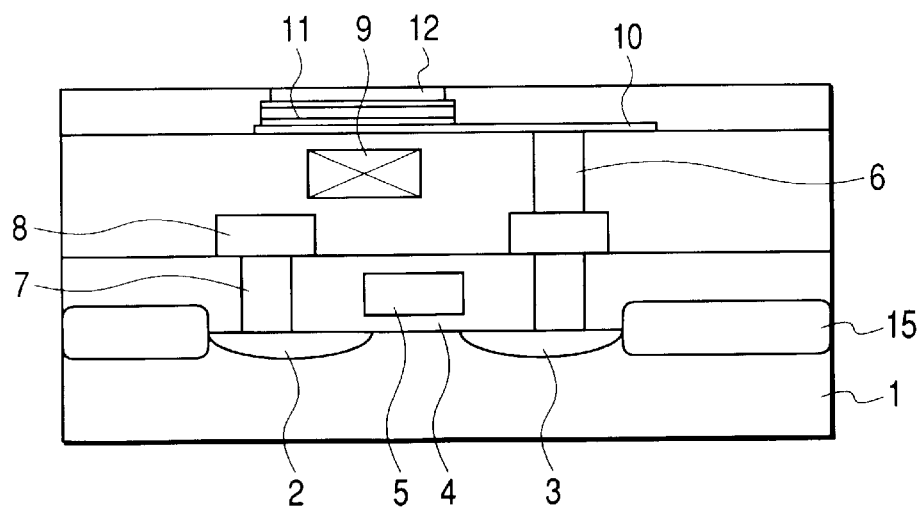
FIG. 15 is a third sectional view showing the experimental manufacturing process of the first specific example.

Further, as shown in FIG. 15, a TMR layer 12 of a laminate structure of $Co/Al_2O_3/NiFe$ is connected to the drain of the field effect transistor through a TiN local wiring 10 and a tungsten plug 6. Note that, in order to horizontally magnetize the TMR layer 12, the TMR layer 12 is provided above the writing line 9.

Figure 16:
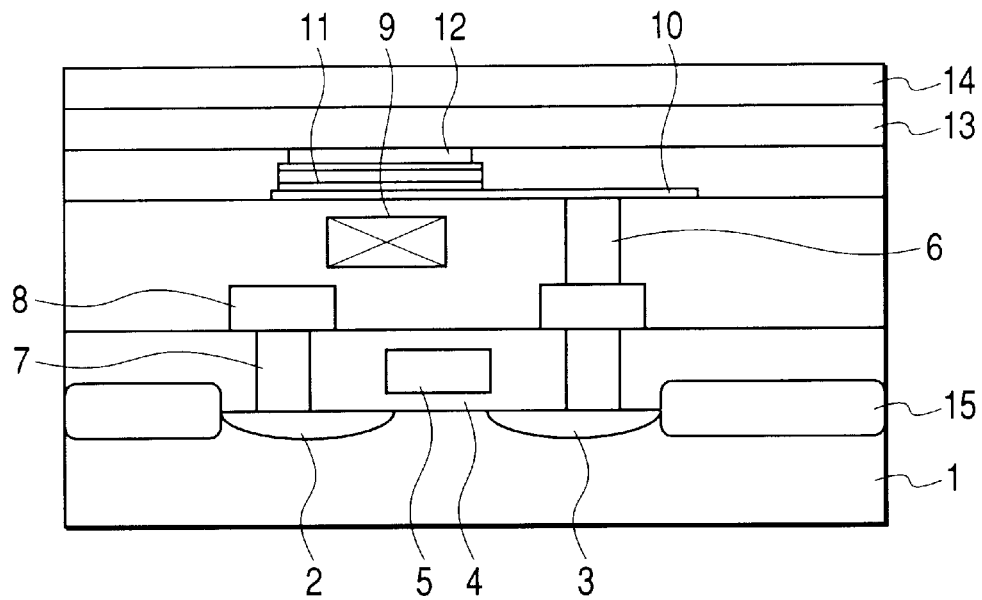
FIG. 16 is a fourth sectional view showing the experimental manufacturing process of the first specific example.

Further, as shown in FIG. 16, the other terminal of the TMR layer 12 is connected to a bit line 13 made of Ti/AlSiCu/Ti.

Further, a peripheral circuit including sense amplifiers SA1, SA2, SA3, SA4 were formed. A memory of such a structure was designed under a 0.5 $\mu$m rule (minimum possible size is 0.5 $\mu$m), and a test chip was formed which included eight units each including 4×4 memory cells.

Timing pulse signals of the respective wirings equivalent to 0 V, 3.3 V, and a clock frequency of 1 MHz as shown in FIG. 10 were inputted to one unit from the outside, and as a result of a differential operation, data of four bits (for example, "1" "0" "1" "0") were observed. Next, when the eight units were activated every $\mu$ second (equivalent to 1 MHz) to drive the respective units, it was possible to confirm that data of four bits was outputted every $\mu$ second.

(Second Specific Example)

Figure 17:
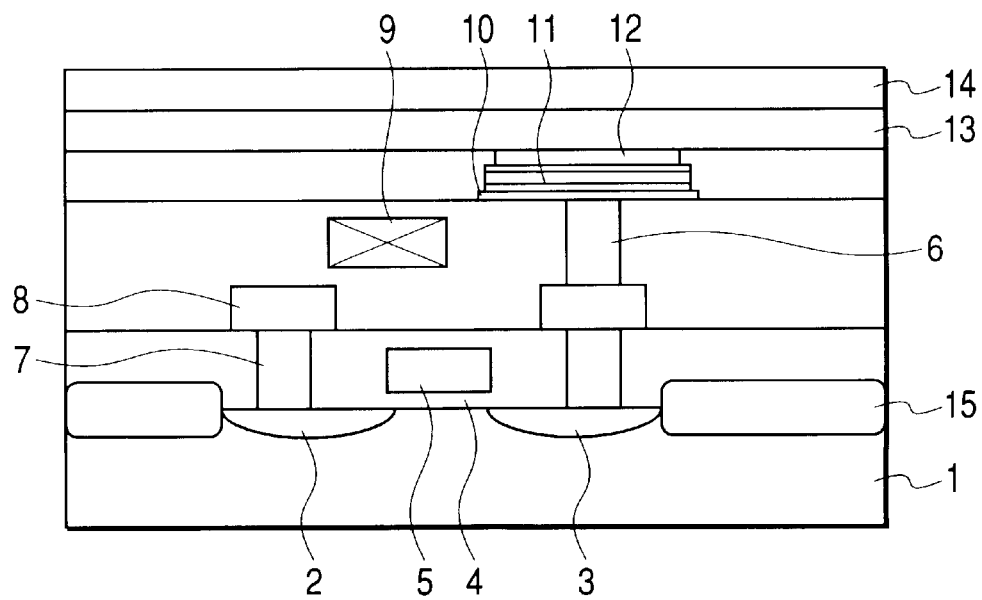
FIG. 17 is a sectional view showing an experimental manufacturing process of a second specific example.

By the same experimental manufacturing process as the first specific example, a memory cell as shown in FIG. 17 was formed. The point different from the first specific example is that such a structure is adopted that a TMR layer 12 made of GdFe/Al2O3/GdFe laminate film is formed and a writing line 9 is provided at the side of the TMR layer 12 to cause the vertical magnetization.

As a result of an operation test similar to the first specific example, which was carried out for this memory cell, it was possible to confirm that both readout and writing were normally operated. Besides, by using the vertical magnetization film for the memory element, the element can be made minute as compared with the in-plane magnetization film, which is further preferable.

What is claimed is:

1. An MRAM comprising a plurality of units each including:
   a plurality of memory elements each of which includes a non-magnetic layer between a hard layer consisting of a magnetic material and a soft layer consisting of a magnetic material having coercive force lower than the hard layer;
   a plurality of bit lines arranged in parallel with each other; and
   a plurality of sense amplifiers connected to the respective bit lines,
   wherein the plurality of sense amplifiers in the same unit are activated at the same time in synchronization with a clock pulse to read out information in parallel in the same unit.

2. An MRAM according to claim 1, further comprising a plurality of switching elements for selecting the memory elements, and word lines intersecting with the bit lines, disposed for every column, and connected to control electrodes of the switching elements, wherein a pulse is applied to the word line connected to the plurality of switching elements for selecting the plurality of memory elements disposed in the same column, so that information is outputted in parallel for every column in the unit.

3. An MRAM according to claim 1, wherein after an electric resistance value of the memory element is detected and held, an electric resistance value after a magnetization direction of the soft layer is inverted by applying a magnetic field is detected, and the electric resistance values before and after the magnetization direction is inverted are inputted to the sense amplifier to reproduce information.

4. An MRAM according to claim 1, wherein the unit includes a circuit for inputting a predetermined reference value as a voltage signal to one terminal of the sense amplifier.

5. An MRAM according to claim 1, wherein the number of the sense amplifiers activated at the same time in each of the units is equal to the number of bits of the information parallel outputted per clock pulse.

6. An MRAM according to claim 1, wherein the memory element is a tunnel magneto-resistance element.

7. An MRAM according to claim 1, wherein a magnetization direction of the magnetic film of the memory element is vertical to a film plane.

8. An MRAM according to claim 1, wherein said plurality of memory elements are arranged in a matrix form.

9. An MRAM according to claim 1, further comprising the units are successively changed over in synchronization with the clock pulse, the same amplifier in the different units are successively activated, so that information in the plurality of units is outputted in synchronization with the clock pulse, and information of each of the units is continuously reproduced.

10. A non-volatile solid-state memory comprising a plurality of units each including:

a plurality of memory elements having at least two different resistance values and arranged in a matrix form;

a plurality of bit lines arranged in parallel with each other; and a plurality of sense amplifiers connected to the respective bit lines, wherein the plurality of sense amplifiers in the same unit are activated at the same time to read out information in the unit, the units are successively changed over in synchronization with a clock pulse, and the sense amplifiers in the different units are successively activated, so that information in the plurality of units is parallel outputted in synchronization with the clock pulse, and information of each of the units is continuously reproduced.

11. A non-volatile solid-state memory comprising a plurality of units each including:

a plurality of memory elements arranged in a matrix form;

a plurality of bit lines arranged in parallel with each other; and a plurality of sense amplifiers connected to the respective bit lines, wherein the plurality of sense amplifiers in the same unit are activated at the same time to read out information in the unit, the units are successively changed over in synchronization with a clock pulse, and the sense amplifiers in the different units are successively activated, so that information in the plurality of units is parallel outputted in synchronization with the clock pulse, and information of each of the units is continuously reproduced.

* * * * *

UNITED STATES PATENT AND TRADEMARK OFFICE
CERTIFICATE OF CORRECTION

PATENT NO. : 6,614,682 B2
DATED : September 2, 2003
INVENTOR(S) : Tadahiko Hirai It is certified that error appears in the above-identified patent and that said Letters Patent is hereby corrected as shown below:

Title page,
Item [56], References Cited, U.S. PATENT DOCUMENTS, insert:
-- 5,654,566     8/1997  Johnson --.

Column 5,
Line 6, "Al2O3" should read -- $Al_2O_3$ --; and
Line 35, "are" should read -- is --.

Column 7,
Line 17, "completes" should read -- complete --.

Column 8,
Line 10, "SiO2" should read -- $SiO_2$ --; and
Line 41, "Al2O3" should read -- $Al_2O_3$ --.

Column 9,
Line 34, "amplifier" should read -- amplifiers --.

Signed and Sealed this

Thirtieth Day of March, 2004

JON W. DUDAS
*Acting Director of the United States Patent and Trademark Office*